US012701999B2

(12) United States Patent
Nakada et al.

(10) Patent No.: US 12,701,999 B2
(45) Date of Patent: Aug. 4, 2026

(54) SEMICONDUCTOR POWER MODULE

(71) Applicant: Mitsubishi Electric Corporation, Tokyo (JP)

(72) Inventors: Katsushi Nakada, Tokyo (JP); Yoshitaka Miyaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 377 days.

(21) Appl. No.: 18/357,646

(22) Filed: Jul. 24, 2023

(65) Prior Publication Data

US 2024/0339373 A1 Oct. 10, 2024

(30) Foreign Application Priority Data

Apr. 5, 2023 (JP) .................................. 2023-061114

(51) Int. Cl.
*H10W 40/22* (2026.01)
*H10W 70/40* (2026.01)
(52) U.S. Cl.
CPC ......... *H10W 40/22* (2026.01); *H10W 70/481* (2026.01)
(58) Field of Classification Search
CPC ............. H01L 23/367; H01L 23/49562; H01L 23/3735; H01L 23/4334; H01L 23/49537; H01L 23/49575; H01L 23/481; H01L 23/49; H10W 40/22; H10W 70/481; H10W 40/255; H10W 40/778; H10W 70/442; H10W 90/811; H10W 20/20; H10W 72/50
See application file for complete search history.

(56) References Cited

U.S. PATENT DOCUMENTS

2017/0092559 A1* 3/2017 Iwasaki ............... H01L 23/3142
2019/0051636 A1* 2/2019 Tonedachi .......... H01L 23/5385

FOREIGN PATENT DOCUMENTS

| JP | 2007-325387 A | 12/2007 |
| JP | 2012-009815 A | 1/2012 |
| JP | 2018-137283 A | 8/2018 |
| JP | 2019-197816 A | 11/2019 |
| JP | 2021-34638 A | 3/2021 |

OTHER PUBLICATIONS

Communication dated Jan. 20, 2026, issued in Japanese Application No. 2023-061114.

* cited by examiner

*Primary Examiner* — Patricia D Valenzuela
(74) *Attorney, Agent, or Firm* — Sughrue Mion, PLLC

(57) ABSTRACT

Provided is a semiconductor power module in which an electric field at corners of electrodes and around the corners is reduced while size reduction and voltage increase are achieved. The semiconductor power module includes a plurality of electrodes having different potentials and laid over each other with an interval therebetween. As seen in a direction in which the plurality of electrodes are laid over each other, each of the plurality of electrodes has three or more corners, at least a part of the corner of one of adjacent two of the electrodes is provided on an outer side relative to another of the adjacent two electrodes, and at least a part of the corner of the other electrode is provided on an outer side relative to the one electrode.

12 Claims, 15 Drawing Sheets

UPPER ELECTRODE
(HIGH-VOLTAGE SIDE)

LOWER ELECTRODE
(LOW-VOLTAGE SIDE)

UPPER ELECTRODE
(HIGH-VOLTAGE SIDE)

SEMICONDUCTOR POWER MODULE

BACKGROUND

The present disclosure relates to a semiconductor power module.

As a semiconductor power module including a semiconductor element, a transfer-molded semiconductor power module obtained by sealing a semiconductor element with thermosetting resin such as epoxy resin, and a gel-sealed semiconductor power module obtained by sealing a semiconductor element with gel-like resin, are used. In particular, the transfer-molded semiconductor power module has a small size and high reliability and therefore is widely used for power control or the like.

Inside such a semiconductor power module, an insulator is provided between a pair of electrodes having a potential difference, so as not to cause dielectric breakdown between the pair of electrodes, whereby insulation between the pair of electrodes is ensured. Locations where insulation is ensured are, for example, between a heat spreader and a cooler, and between lead frames arranged being laid over each other. If size reduction and voltage increase of the semiconductor power module are merely carried out at such locations where insulation is needed, a high electric field is generated at these locations. In particular, an electric field becomes high at a corner of an electrode, leading to reduction in insulation performance. Thus, it becomes difficult to achieve size reduction and voltage increase at a corner of an electrode.

Meanwhile, disclosed is a configuration in which lead frames in which currents flow in opposite directions are closely arranged being laid over each other in the up-down direction, so that inductances are canceled out with each other in this area and the internal inductance of the semiconductor power module is reduced, thereby reducing impedance loss due to increase in the frequency of used voltage of the semiconductor power module (for example, Patent Document 1). In this configuration, electrodes need to be brought close to each other to an extent in which an inductance reduction effect is obtained. If the electrodes are brought extremely close to each other, an electric field between the electrodes becomes an insulator breakdown electric field intensity or greater, so that insulation breakdown might occur between the electrodes. Therefore, it is necessary to ensure a certain distance or longer between the electrodes, and thus an inductance reduction effect is not sufficiently obtained.

In order to solve the above problems, disclosed is a semiconductor power module in which, regarding a pair of electrodes having a potential difference, one electrode is formed so as to protrude relative to the other electrode, thereby relaxing an electric field around a corner of the one electrode (for example, Patent Document 2). In addition, disclosed is a semiconductor power module in which one electrode is formed so as to protrude relative to the other electrode and an insulator having lower permittivity than sealing resin is provided at the protruding part, thereby relaxing an electric field (for example, Patent Document 3).

Patent Document 1: Japanese Laid-Open Patent Publication No. 2018-137283
Patent Document 2: Japanese Laid-Open Patent Publication No. 2019-197816
Patent Document 3: Japanese Laid-Open Patent Publication No. 2012-9815

In the configuration of the semiconductor power module in Patent Document 2, an electric field around a corner of one protruding electrode can be relaxed. However, an electric field around a corner of the other electrode laid over the one protruding electrode becomes higher than in a case where corners of the one electrode and the other electrode overlap each other in a plan view. Since the electric field around the corner of the other electrode becomes high, insulation performance around the corner of the other electrode is reduced, and thus it becomes difficult to achieve size reduction and voltage increase of the semiconductor power module.

In the configuration of the semiconductor power module in Patent Document 3, a corner of one electrode and the other electrode overlap each other in a plan view, but since the insulator having lower permittivity than the sealing resin is provided, an electric field around the corner of the electrode can be reduced. However, since the insulator having lower permittivity than the sealing resin needs to be provided, the number of manufacturing steps increases, leading to cost increase, and since the insulator needs to be provided in addition to the sealing resin, the probability of occurrence of an insulation defect such as a void increases, thus increasing a risk of reduction in insulation performance of the semiconductor power module.

SUMMARY

Accordingly, an object of the present disclosure is to provide a semiconductor power module in which an electric field at corners of electrodes and around the corners is reduced while size reduction and voltage increase are achieved.

A semiconductor power module according to the present disclosure includes a plurality of electrodes having different potentials and laid over each other with an interval therebetween. As seen in a direction in which the plurality of electrodes are laid over each other, each of the plurality of electrodes has three or more corners, at least a part of the corner of one of adjacent two of the electrodes is provided on an outer side relative to another of the adjacent two electrodes, and at least a part of the corner of the other electrode is provided on an outer side relative to the one electrode.

The semiconductor power module according to the present disclosure includes the plurality of electrodes having different potentials and laid over each other with an interval therebetween. As seen in the direction in which the plurality of electrodes are laid over each other, each of the plurality of electrodes has three or more corners, at least a part of the corner of one of the adjacent two electrodes is provided on the outer side relative to the other electrode, and at least a part of the corner of the other electrode is provided on the outer side relative to the one electrode. Therefore, the corner of the one electrode is not laid over the other electrode as seen in the direction in which the adjacent two electrodes are laid over each other, and the corner of the other electrode is not laid over the one electrode as seen in the direction in which the adjacent two electrodes are laid over each other. Thus, for both electrodes, the electric field at the corners of the electrodes and around the corners can be reduced. Since the electric field at the corners of the electrodes and around the corners is reduced, voltage increase of the semiconductor power module can be achieved. In addition, since an additional insulator as in Patent Document 3 is not needed, the number of manufacturing steps does not increase and the probability of occurrence of an insulation defect such as a void does not increase. Thus, size reduction and voltage increase of the semiconductor power module can be achieved.

DETAILED DESCRIPTION OF THE EMBODIMENTS

Figure 1:
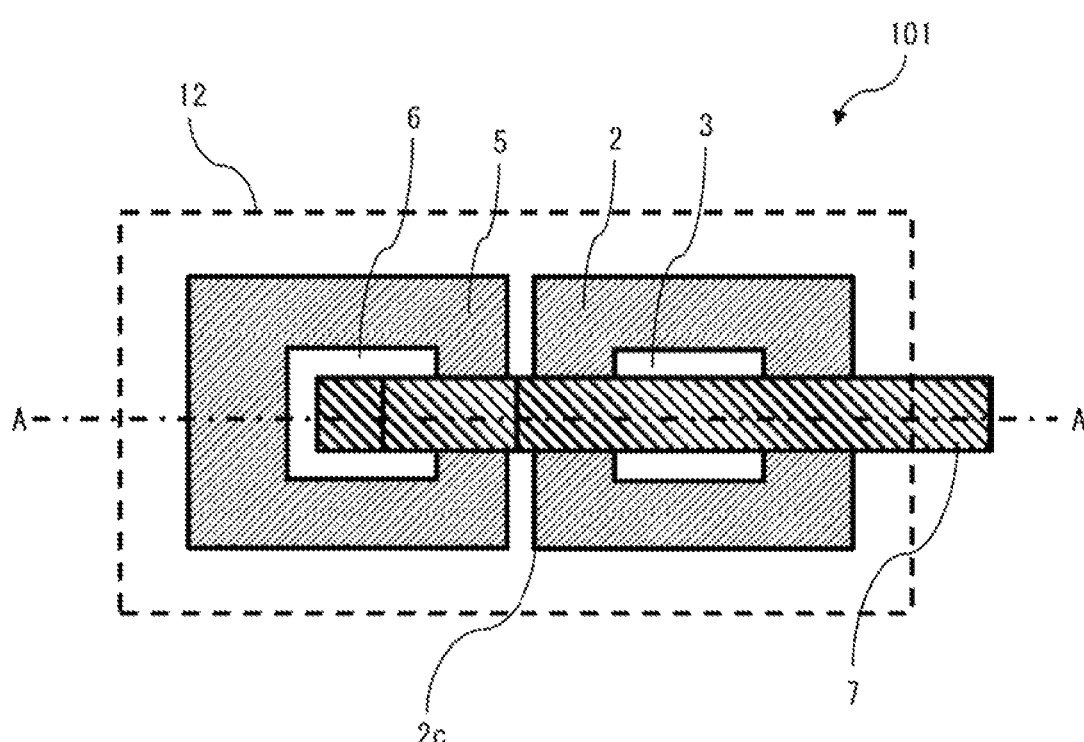
FIG. 1 is a plan view schematically showing a semiconductor power module according to the first embodiment of the present disclosure.

Hereinafter, semiconductor power modules according to embodiments of the present disclosure will be described with reference to the drawings. In the drawings, the same or corresponding members and parts are denoted by the same reference characters, to give description.

First Embodiment

Figure 2:
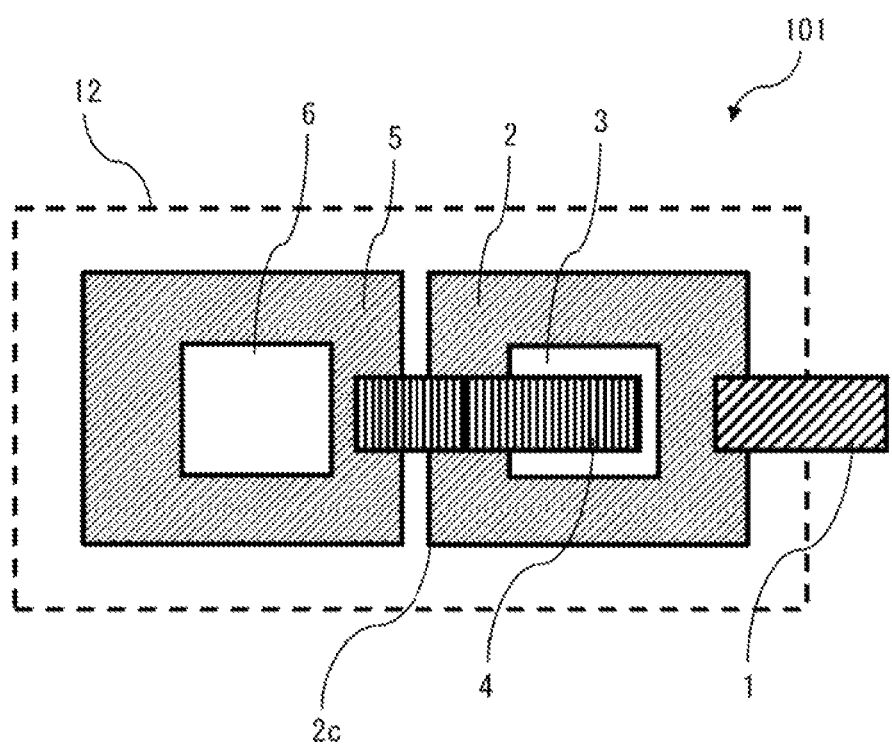
FIG. 2 is another plan view schematically showing the semiconductor power module according to the first embodiment.
Figure 3:
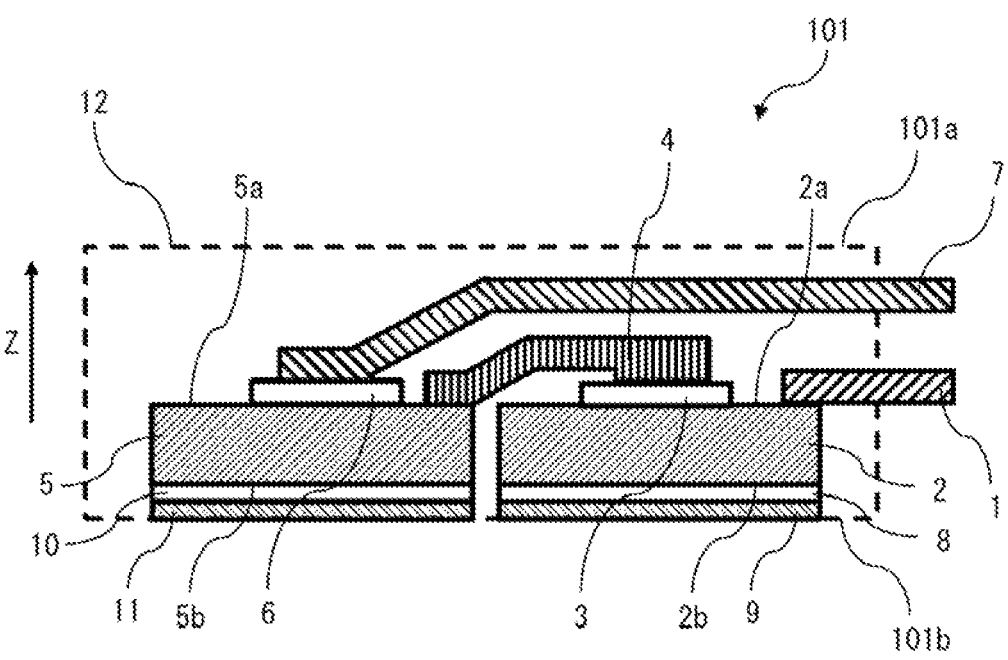
FIG. 3 is a sectional view schematically showing the semiconductor power module taken at an A-A cross-section position in FIG. 1.

FIG. 1 is a plan view schematically showing a semiconductor power module 101 according to the first embodiment of the present disclosure, with sealing resin 12 removed. FIG. 2 is another plan view schematically showing the semiconductor power module 101, with a third lead frame 7 removed from FIG. 1. FIG. 3 is a sectional view schematically showing the semiconductor power module 101 taken at an A-A cross-section position in FIG. 1. The semiconductor power module 101 for power conversion is mainly provided to a power conversion device for converting desired power to DC or AC voltage. The semiconductor power module 101 has power semiconductor elements therein. The semiconductor power module 101 converts power through switching operations of the power semiconductor elements.

\<Semiconductor Power Module 101\>

As shown in FIG. 3, the semiconductor power module 101 includes heat spreaders, the power semiconductor elements, conductive layers, lead frames, and the sealing resin 12. In the present embodiment, the outer shape of the semiconductor power module 101 is a rectangular parallelepiped shape formed by the sealing resin 12. The heat spreaders are a first heat spreader 2 and a second heat spreader 5 which are formed in plate shapes and arranged side by side. The power semiconductor elements are a first power semiconductor element 3 formed in a plate shape and joined to a one-side surface of the first heat spreader 2, and a second power semiconductor element 6 formed in a plate shape and joined to a one-side surface of the second heat spreader 5. The conductive layers are a first conductive layer 9 formed in a plate shape and joined to an other-side surface of the first heat spreader 2 via a first insulating layer 8 which is an insulating layer, and a second conductive layer 11 formed in a plate shape and joined to an other-side surface of the second heat spreader 5 via a second insulating layer 10 which is an insulating layer.

The lead frames are wiring members. The lead frames are a first lead frame 1 whose other-side surface is joined to the one-side surface of the first heat spreader 2, a second lead frame 4 which extends in an arrangement direction of the heat spreaders and whose other-side surface is, at one end, joined to a one-side surface of the first power semiconductor element 3, and is, at another end, joined to the one-side surface of the second heat spreader 5, and the third lead frame 7 which extends in the arrangement direction of the heat spreaders and whose other-side surface is, at one end, joined to a one-side surface of the second power semiconductor element 6 and is, at least partially, arranged being laid over a one-side surface of the second lead frame 4 with an interval therebetween.

In the following description, an upper surface of the semiconductor power module 101 shown in FIG. 3 is referred to as a one-side surface 101*a* of the semiconductor power module 101, and a lower surface of the semiconductor power module 101 is referred to as an other-side surface 101*b* of the semiconductor power module 101. However, the one-side surface 101*a* is not limited to a surface located on the upper side when the semiconductor power module 101 is used, and the other-side surface 101*b* is not limited to a surface located on the lower side when the semiconductor power module 101 is used. FIG. 1 and FIG. 2 are plan views of the semiconductor power module 101 shown in FIG. 3, as seen from the one-side surface 101*a* side, and show the internal structure with the sealing resin 12 removed. Broken lines in FIG. 1 to FIG. 3 indicate the outer shape of the sealing resin 12.

The details of each member composing the semiconductor power module 101 will be described. The first heat spreader 2 and the second heat spreader 5 are members having flat-plate shapes and serving as bases for the entire semiconductor power module 101. In the present embodiment, as shown in FIG. 1, the shapes of the first heat spreader 2 and the second heat spreader 5 are rectangular shapes as seen in a direction perpendicular to the one-side surface 101*a*. The shapes of the first heat spreader 2 and the second heat spreader 5 are not limited to rectangular shapes, and may be, for example, polygonal shapes other than rectangular shapes. In the present embodiment, since the shapes of the first heat spreader 2 and the second heat spreader 5 are rectangular shapes, each of the first heat spreader 2 and the second heat spreader 5 has four corners as seen in the direction perpendicular to the one-side surface 101a. The lower left corner of the first heat spreader 2 is referred to as a corner 2c.

As shown in FIG. 3, where a direction perpendicular to a first surface 2a which is the one-side surface of the first heat spreader 2 is defined as a height direction (hereinafter, referred to as a Z direction), the dimensions in the Z direction of the first heat spreader 2 and the second heat spreader 5 are equal to each other. The first surface 2a of the first heat spreader 2 and a first surface 5a which is the one-side surface of the second heat spreader 5 are flush with each other, and a second surface 2b which is the other-side surface of the first heat spreader 2 and a second surface 5b which is the other-side surface of the second heat spreader 5 are flush with each other. The heights of the first heat spreader 2 and the second heat spreader 5 are not limited thereto, and the heights of the first heat spreader 2 and second heat spreader 5 may be different from each other.

As the materials of the heat spreaders, metal that is excellent in electrical property and mechanical property is used. Preferably, the materials of the heat spreaders are aluminum (Al), copper (Cu), silver (Ag), nickel (Ni), gold (Au), an alloy containing two or more kinds of metals, or a composite material (Al—SiC) containing silicon carbide and aluminum, for example. However, the materials of the first heat spreader 2 and the second heat spreader 5 are not limited thereto.

The first power semiconductor element 3 is joined to the first surface 2a of the first heat spreader 2, and the second power semiconductor element 6 is joined to the first surface 5a of the second heat spreader 5. Each power semiconductor element is, for example, an insulated gate bipolar transistor (IGBT), a free wheel diode (FWD), or a metal oxide semiconductor field effect transistor (MOSFET). In general, the IGBT and the MOSFET each have three electrodes which are a gate, a source, and a drain (or a gate, an emitter, and a collector). In the power semiconductor element, large current flowing between the source (emitter) and the drain (collector) is controlled by changing gate voltage which is voltage applied to the gate. In the drawings, gates which are control electrodes, and control wires connected to the gates, are not shown.

In the present embodiment, as shown in FIG. 2, the shapes of the power semiconductor elements are rectangular shapes as seen in the direction perpendicular to the one-side surface 101a, one first power semiconductor element 3 is placed on the first heat spreader 2, and one second power semiconductor element 6 is placed on the second heat spreader 5. The types, the shapes, and the number of the power semiconductor elements are not limited to the above ones. The shapes of the power semiconductor elements may be other than rectangular shapes, and the number of the power semiconductor elements may be plural for each heat spreader.

As shown in FIG. 3, the other-side surface at one end of the first lead frame 1 is joined to the first surface 2a of the first heat spreader 2, and another end of the first lead frame 1 is exposed from the sealing resin 12. The other-side surface at one end of the second lead frame 4 is joined to a surface electrode on the one-side surface of the first power semiconductor element 3, and the other-side surface at another end is joined to the first surface 5a of the second heat spreader 5. The other-side surface at one end of the third lead frame 7 is joined to a surface electrode on the one-side surface of the second power semiconductor element 6, and another end of the third lead frame 7 is exposed from the sealing resin 12. As the materials of the lead frames, metal having high electric conductivity is used. Preferably, the materials of the lead frames are copper (Cu), aluminum (Al), or an alloy containing at least one of these metals, for example. However, the materials of the lead frames are not limited thereto.

The first insulating layer 8 is provided at the second surface 2b of the first heat spreader 2, and the second insulating layer 10 is provided at the second surface 5b of the second heat spreader 5. The shapes of the insulating layers are rectangular shapes as seen in the direction perpendicular to the one-side surface 101a. The shapes of the insulating layers are not limited thereto. As shown in FIG. 3, the dimensions in the Z direction of the first insulating layer 8 and the second insulating layer 10 are equal to each other, and their respective one-side surfaces and other-side surfaces are flush with each other. The heights of the first insulating layer 8 and the second insulating layer 10 are not limited thereto, and the heights of the first insulating layer 8 and the second insulating layer 10 may be different from each other. The materials of the insulating layers are epoxy resin, urethane resin, silicon resin, polyimide resin, polyamide resin, polyamide-imide resin, acrylic resin, a rubber material, or ceramic, for example. The materials of the insulating layers are not limited thereto and may be another material.

The first conductive layer 9 is provided at the other-side surface of the first insulating layer 8, and the second conductive layer 11 is provided at the other-side surface of the second insulating layer 10. The shapes of the conductive layers are rectangular shapes as seen in the direction perpendicular to the one-side surface 101a. The shapes of the conductive layers are not limited thereto. As shown in FIG. 3, the dimensions in the Z direction of the first conductive layer 9 and the second conductive layer 11 are equal to each other, and their respective one-side surfaces and other-side surfaces are flush with each other. The heights of the first conductive layer 9 and the second conductive layer 11 are not limited thereto, and the heights of the first conductive layer 9 and the second conductive layer 11 may be different from each other. As the materials of the conductive layers, metal having high electric conductivity is used. Preferably, the materials of the conductive layers are copper (Cu), aluminum (Al), or an alloy containing at least one of these metals, for example. However, the materials of the conductive layers are not limited thereto.

Joining between the heat spreader and the power semiconductor element, joining between the heat spreader and the lead frame, and joining between the power semiconductor element and the lead frame, are made via joining materials (the joining materials are not shown). As the joining materials, high-temperature solder containing lead (Pb) and tin (Sn), a silver (Ag) nanoparticle paste, or a conductive adhesive containing silver particles and epoxy resin, is used, for example. The kinds of the joining materials are not limited thereto.

The sealing resin 12 seals the heat spreaders, the power semiconductor elements, the insulating layers, the conductive layers, and the lead frames in a state in which the first lead frame 1 and the third lead frame 7 are partially exposed. The material of the sealing resin 12 is epoxy resin, urethane resin, silicon resin, polyimide resin, polyamide resin, polyamide-imide resin, acrylic resin, or a rubber material, for example. The sealing resin 12 may be formed by overlaying a plurality of resin materials, e.g., gel-like silicon resin and epoxy resin. The kind of the sealing resin 12 is not limited thereto. The outer shape of the semiconductor power module 101 sealed by the sealing resin 12 is a rectangular parallelepiped shape. However, the outer shape of the semiconductor power module 101 is not limited to a rectangular parallelepiped shape. In the present embodiment, other-side surfaces of the conductive layers are exposed from the sealing resin 12, and the other-side surfaces of the conductive layers are joined to a cooler (not shown). With this configuration, the semiconductor power module 101 can be efficiently cooled.

Next, potentials that components of the semiconductor power module 101 have will be described with reference to FIG. 3. The first heat spreader 2 has a potential different from that of the second heat spreader 5. For example, the first heat spreader 2 has a P-side potential and the second heat spreader 5 has an AC-side potential.

Each of the lead frames has a potential equal to that of the heat spreader joined therewith or the electrode of the power semiconductor element joined therewith. In a case where the first heat spreader 2 has a P-side potential and the second heat spreader 5 has an AC-side potential, the first lead frame 1 joined to the first heat spreader 2 has the P-side potential and the second lead frame 4 joined to the second heat spreader 5 has the AC-side potential. The third lead frame 7 joined to the electrode on the one-side surface of the second power semiconductor element 6 has the N-side potential. The conductive layers have a ground potential.

That is, there are potential differences between the heat spreader and the conductive layer and between the second lead frame 4 and the third lead frame 7. Each pair of, the heat spreader and the conductive layer, and the second lead frame 4 and the third lead frame 7, are adjacent two electrodes laid over each other with an interval therebetween. In particular, due to the characteristics of an electric field, equipotential lines more concentrate on corners of these electrodes, and therefore the electric field is high at the corners of these electrodes.

Comparative Example

Figure 4:
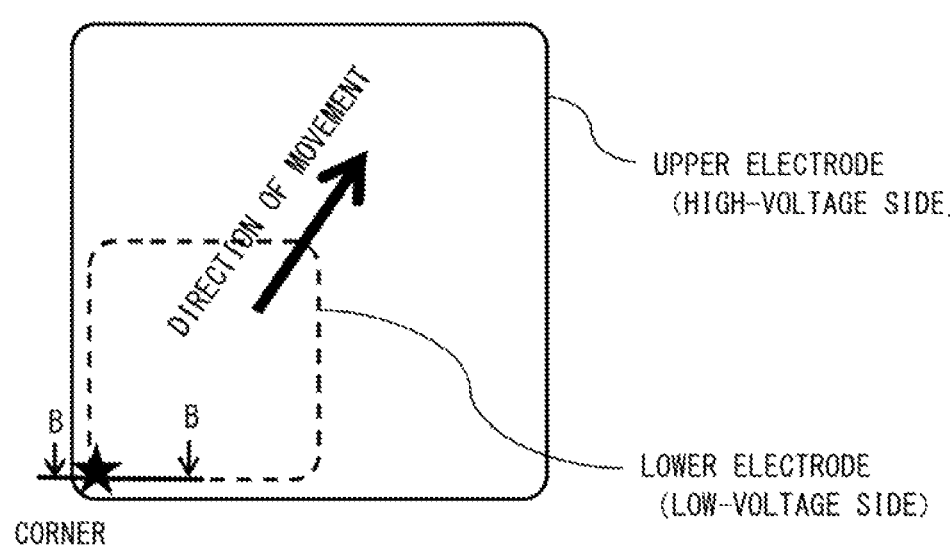
FIG. 4 is a plan view showing electrodes of a semiconductor power module in a comparative example.
Figure 5:
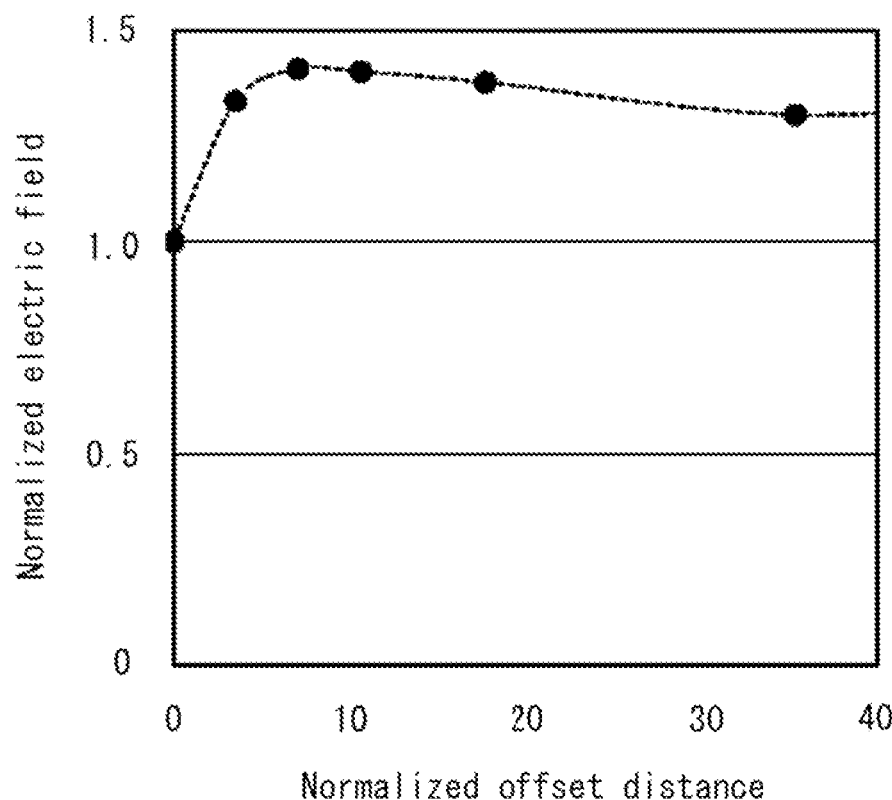
FIG. 5 shows a normalized electric field value at a corner of the electrode in the comparative example.
Figure 6:
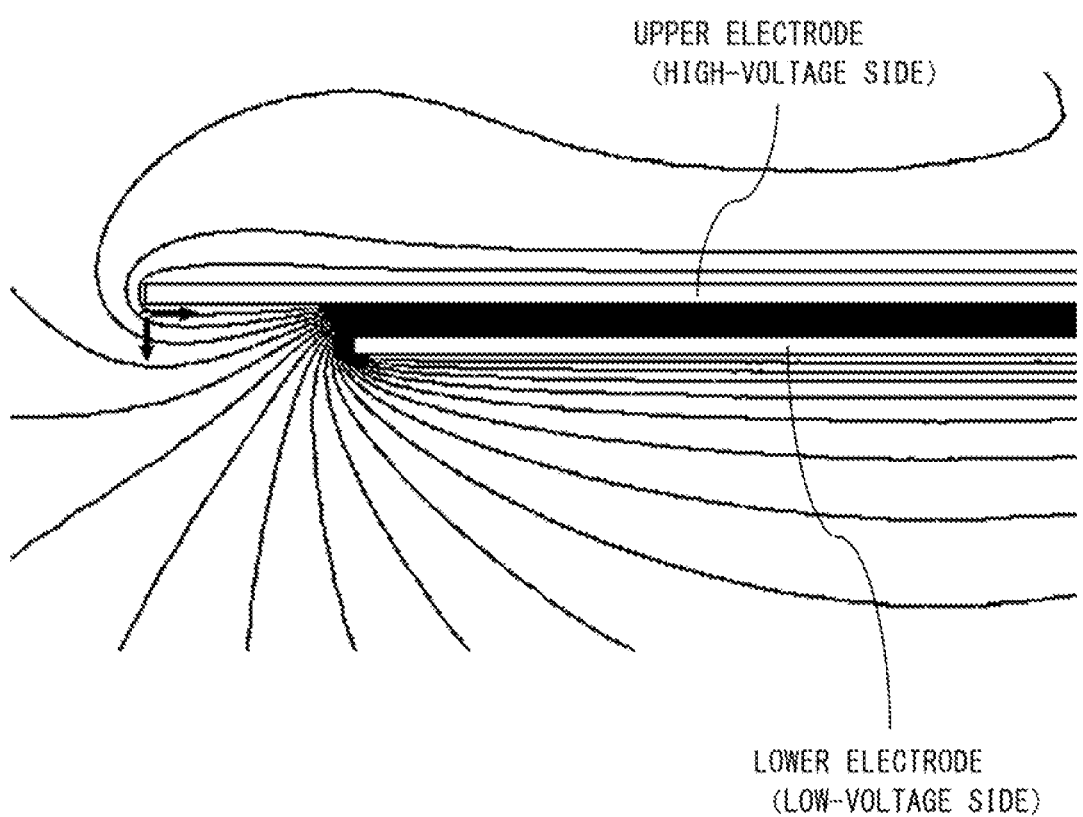
FIG. 6 is an equipotential line diagram around the electrodes of the semiconductor power module in the comparative example.

Before description of a major part of the present disclosure, a comparative example will be described. FIG. 4 is a plan view showing two electrodes arranged being laid over each other in a semiconductor power module in the comparative example. FIG. 5 shows a normalized electric field value at a corner of the electrode in the comparative example. FIG. 6 is an equipotential line diagram around the corners of the electrodes of the semiconductor power module in the comparative example, taken at a B-B cross-section position in FIG. 4. In FIG. 4, an upper electrode indicated by a solid line and a lower electrode indicated by a broken line are arranged being laid over each other with an interval therebetween. The upper electrode and the lower electrode have different potentials, i.e., the upper electrode is on a high-voltage side and the lower electrode is on a low-voltage side. As seen in a direction perpendicular to an electrode surface, the lower electrode is provided on the inner side relative to the upper electrode, the corner of the upper electrode and the corner of the lower electrode are not laid over each other, and the corner of the upper electrode protrudes outward relative to the corner of the lower electrode.

The horizontal axis in FIG. 5 indicates a normalized value of a distance between the lower electrode and the upper electrode, and a case where this value is 0 indicates a state where both are laid over each other. The vertical axis in FIG. 5 indicates an electric field at the corner part (star-mark part in FIG. 4) of the lower electrode normalized such that the electric field when the corners of the lower electrode and the upper electrode are laid over each other is defined as 1. From FIG. 5, it is found that, when the lower electrode is moved to the inner side of the upper electrode, the electric field at the corner of the lower electrode becomes higher than that in the state in which both corners are aligned with each other. From FIG. 6, it is found that, when one electrode is moved to the inner side of the other electrode, equipotential lines concentrate on an end of the inner-side electrode so that the electric field becomes high at the end of the inner-side electrode. That is, in a case where the corner of the one electrode is laid over the other electrode as seen in the direction perpendicular to the electrode surface, the electric field around the corner of the one electrode becomes high, and insulation performance is reduced at the part where the electric field becomes high. Thus, it becomes difficult to achieve size reduction and voltage increase of the semiconductor power module.

<Electric Field Relaxing Structure at Corner of Electrode>

Figure 7:
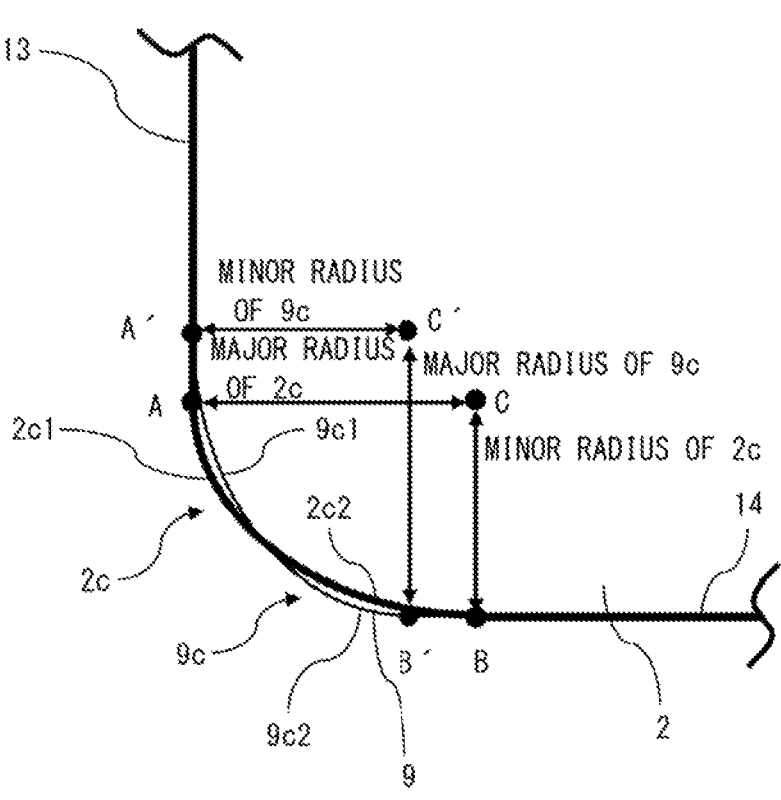
FIG. 7 is a plan view showing corners of adjacent two electrodes of the semiconductor power module according to the first embodiment.
Figure 8:
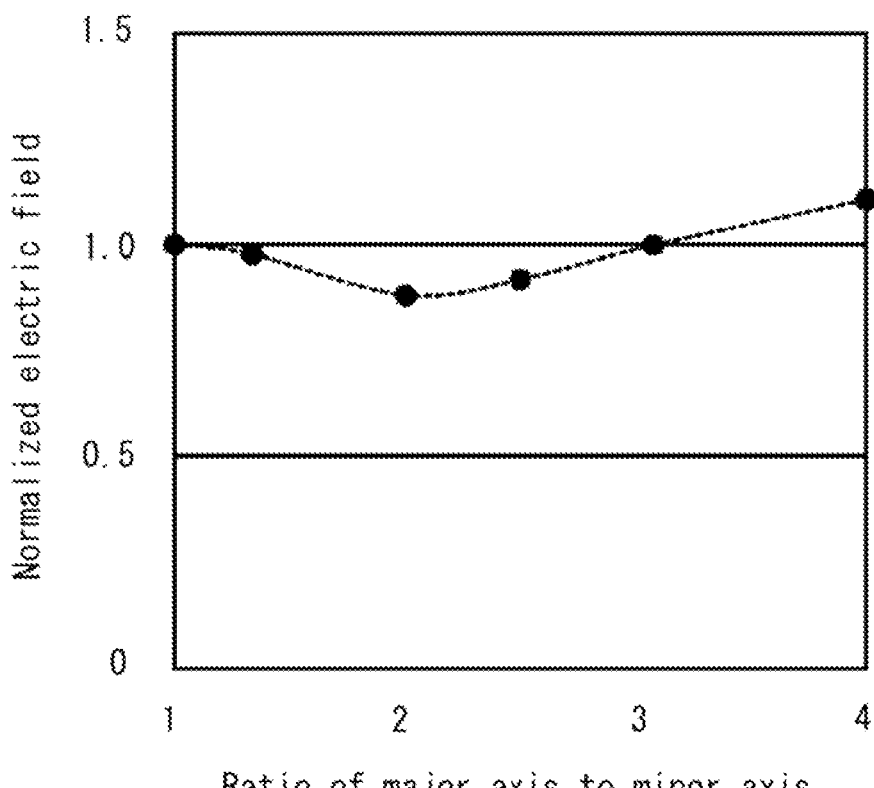
FIG. 8 shows a normalized electric field value at the corner of the electrode of the semiconductor power module according to the first embodiment.

As an electric field relaxing structure at the corner of the electrode, which is a major part of the present disclosure, the configuration of arrangement of corners of adjacent two electrodes will be described. FIG. 7 is a plan view showing corners of adjacent two electrodes of the semiconductor power module 101 according to the first embodiment, and is an enlarged view around the corner 2c of the first heat spreader 2 shown in FIG. 1. FIG. 8 shows a normalized electric field value at the corner of the electrode of the semiconductor power module 101. In FIG. 7, only the first heat spreader 2 and the first conductive layer 9 are shown. The corner of the first conductive layer 9 shown in FIG. 7 is referred to as a corner 9c.

The semiconductor power module 101 includes a plurality of electrodes having different potentials and laid over each other with an interval therebetween. As seen in a direction in which the plurality of electrodes are laid over each other, each of the plurality of electrodes has three or more corners. In the present embodiment, the plurality of electrodes are the heat spreaders, the conductive layers, and the lead frames. Pairs of adjacent two electrodes are the heat spreader and the conductive layer, and the second lead frame 4 and the third lead frame 7. These electrodes are formed in rectangular shapes as seen in the direction in which the plurality of electrodes are laid over each other. Therefore, as seen in the direction in which the plurality of electrodes are laid over each other, each of these electrodes has four corners. The number of corners that each of the plurality of electrodes has is not limited to four, and may be three, or five or more.

As seen in the direction in which the plurality of electrodes are laid over each other, at least a part of the corner of one of the adjacent two electrodes is provided on the outer side relative to the other electrode, and at least a part of the corner of the other electrode is provided on the outer side relative to the one electrode. With this configuration, the corner of the one electrode is not laid over the other electrode as seen in the direction perpendicular to the electrode surface, and the corner of the other electrode is not laid over the one electrode as seen in the direction perpendicular to the electrode surface. Thus, for both electrodes, the electric field at the corners of the electrodes and around the corners can be reduced. Since the electric field at the corners of the electrodes and around the corners is reduced, voltage increase of the semiconductor power module can be achieved. In addition, since an additional insulator as in Patent Document 3 is not needed, the number of manufacturing steps does not increase and the probability of occurrence of an insulation defect such as a void does not increase. Thus, size reduction and voltage increase of the semiconductor power module can be achieved. Hereinafter, the details of the electric field relaxing structure in the present embodiment will be described.

The plurality of electrodes are formed in plate shapes, and as shown in FIG. 7, side-line parts on both sides of the corners of the adjacent two electrodes overlap each other as seen in the direction in which the plurality of electrodes are laid over each other. In the adjacent two electrodes, the shape of the corner of the one electrode and the shape of the corner of the other electrode are different from each other such that a first part of the corner of the one electrode is located on the outer side relative to a first part of the corner of the other electrode, and a second part of the corner of the other electrode is located on the outer side relative to a second part of the corner of the one electrode. In FIG. 7, a first part 2*c1* of the corner 2*c* which is the corner of the one electrode is located on the outer side relative to a first part 9*c1* of the corner 9*c* which is the corner of the other electrode, and a second part 9*c2* of the corner 9*c* is located on the outer side relative to a second part 2*c2* of the corner 2*c*.

With this configuration, since side-line parts on both sides of the corners of the adjacent two electrodes overlap each other as seen in the direction in which the plurality of electrodes are laid over each other, it is possible to reduce the electric field around the corners of the electrodes without using a jig having a complicated structure for fixing the electrodes at the time of molding the semiconductor power module 101 with the sealing resin 12. Since a jig having a complicated structure is not needed, productivity of the semiconductor power module 101 can be improved.

In the present embodiment shown in FIG. 7, the shape of the corner 2*c*, 9*c* of each of the adjacent two electrodes is an elliptical-arc shape. In each corner 2*c*, 9*c*, a first distance from a curvature start point to a curvature middle point of the elliptical-arc shape and a second distance from a curvature end point to the curvature middle point of the elliptical-arc shape, are different from each other. The longer one of the first distance and the second distance is defined as a major radius and the shorter one is defined as a minor radius. In FIG. 7, one overlapping side line is referred to as a first side line 13, and the other overlapping side line is referred to as a second side line 14. A major radius AC of the corner 2*c* is parallel to the second side line 14, and a minor radius BC of the corner 2*c* is parallel to the first side line 13. A major radius B'C' of the corner 9*c* is parallel to the first side line 13, and a minor radius A'C' of the corner 9*c* is parallel to the second side line 14. The major radiuses in the adjacent two electrodes cross each other as seen in the direction in which the plurality of electrodes are laid over each other.

With this configuration, the first part 2*c1* of the corner 2*c* which is the corner of the one electrode is located on the outer side relative to the first part 9*c1* of the corner 9*c* which is the corner of the other electrode, so that it is possible to easily form such a shape that the second part 9*c2* of the corner 9*c* is located on the outer side relative to the second part 2*c2* of the corner 2*c*. For both electrodes, it is possible to easily form such a shape that the electric field at the corners of the electrodes and around the corners is reduced, and thus productivity of the semiconductor power module

101 can be improved. In addition, side-line parts on both sides of the corners of the adjacent two electrodes overlap each other as seen in the direction in which the plurality of electrodes are laid over each other. Thus, it is possible to reduce the electric field around the corners of the electrodes without using a jig having a complicated structure for fixing the electrodes at the time of molding the semiconductor power module 101 with the sealing resin 12.

The horizontal axis in FIG. 8 indicates the ratio of the major radius to the minor radius. A case where the value on the horizontal axis is 1 corresponds to a case where the shapes of the corners 2*c*, 9*c* are circular-arc shapes. The vertical axis in FIG. 8 indicates the electric field at the corner 2*c* normalized such that the electric field when the corners 2*c*, 9*c* are laid over each other, i.e., when the shapes of the corners 2*c*, 9*c* are circular-arc shapes, is defined as 1. The electric field at the corner 9*c* also exhibits a tendency similar to that in FIG. 8. From FIG. 8, it is found that, when the ratio of the major radius to the minor radius is greater than 1 and not greater than 3, the electric field at the corners 2*c*, 9*c* becomes smaller than that when the corners 2*c*, 9*c* are laid over each other. Therefore, it is desirable that, in each of the adjacent two electrodes, the ratio of the major radius to the minor radius is not greater than 3. With this configuration, the electric field at the corners 2*c*, 9*c* can be assuredly made smaller than that when the corners 2*c*, 9*c* are laid over each other.

Also for the other corners not shown in FIG. 7, the shapes of the corners of the adjacent electrodes are different from each other in the same manner. Also the corners of a pair of electrodes that are the second lead frame 4 and the third lead frame 7 can be formed in such a shape that, in particular, a projecting part of the corner of the one electrode is not laid over the other electrode as seen in the direction perpendicular to the electrode surface. That is, either pair or each pair of, the heat spreader and the conductive layer, and the second lead frame 4 and the third lead frame 7, are the adjacent two electrodes. With this configuration, also between the second lead frame 4 and the third lead frame 7, the electric field at the corners of the electrodes and around the corners can be reduced.

As described above, the semiconductor power module 101 according to the first embodiment includes a plurality of electrodes having different potentials and laid over each other with an interval therebetween. As seen in a direction in which the plurality of electrodes are laid over each other, each of the plurality of electrodes has three or more corners, at least a part of the corner of one of adjacent two of the electrodes is provided on an outer side relative to another of the adjacent two electrodes, and at least a part of the corner of the other electrode is provided on an outer side relative to the one electrode. Therefore, the corner of the one electrode is not laid over the other electrode as seen in the direction in which the adjacent two electrodes are laid over each other, and the corner of the other electrode is not laid over the one electrode as seen in the direction in which the adjacent two electrodes are laid over each other. Thus, for both electrodes, the electric field at the corners of the electrodes and around the corners can be reduced. Since the electric field at the corners of the electrodes and around the corners is reduced, voltage increase of the semiconductor power module 101 can be achieved. In addition, since an additional insulator as in Patent Document 3 is not needed, the number of manufacturing steps does not increase and the probability of occurrence of an insulation defect such as a void does not increase. Thus, size reduction and voltage increase of the semiconductor power module 101 can be achieved. Further, since an electric field relaxing effect is obtained, work for removing burr which is one of causes for increasing the electric field can be omitted, whereby the takt time for the semiconductor power module 101 can be shortened. Also, impedance loss due to increase in the frequency of used voltage of the semiconductor power module 101 can be reduced.

The plurality of electrodes may be formed in plate shapes. Side-line parts on both sides of the corners of the adjacent two electrodes may overlap each other as seen in the direction in which the plurality of electrodes are laid over each other. In the adjacent two electrodes, a shape of the corner of the one electrode and a shape of the corner of the other electrode may be different from each other such that a first part of the corner of the one electrode is located on an outer side relative to a first part of the corner of the other electrode, and a second part of the corner of the other electrode is located on an outer side relative to a second part of the corner of the one electrode. Thus, since side-line parts on both sides of the corners of the adjacent two electrodes overlap each other as seen in the direction in which the plurality of electrodes are laid over each other, it is possible to reduce the electric field around the corners of the electrodes without using a jig having a complicated structure for fixing the electrodes at the time of molding the semiconductor power module 101 with the sealing resin 12. Since a jig having a complicated structure is not needed, productivity of the semiconductor power module 101 can be improved.

The shape of the corner of each of the adjacent two electrodes may be an elliptical-arc shape, and a first distance from a curvature start point to a curvature middle point of the elliptical-arc shape and a second distance from a curvature end point to the curvature middle point of the elliptical-arc shape may be different from each other. A longer one of the first distance and the second distance may be defined as a major radius and a shorter one may be defined as a minor radius. The major radiuses in the adjacent two electrodes may cross each other as seen in the direction in which the plurality of electrodes are laid over each other. Thus, the first part 2$cl$ of the corner 2$c$ which is the corner of the one electrode is located on the outer side relative to the first part 9$c1$ of the corner 9$c$ which is the corner of the other electrode, so that it is possible to easily form such a shape that the second part 9$c2$ of the corner 9$c$ is located on the outer side relative to the second part 2$c2$ of the corner 2$c$. For both electrodes, it is possible to easily form such a shape that the electric field around the corners of the electrodes is reduced, and thus productivity of the semiconductor power module 101 can be improved. In addition, side-line parts on both sides of the corners of the adjacent two electrodes overlap each other as seen in the direction in which the plurality of electrodes are laid over each other. Thus, it is possible to reduce the electric field around the corners of the electrodes without using a jig having a complicated structure for fixing the electrodes at the time of molding the semiconductor power module 101 with the sealing resin 12.

In each of the adjacent two electrodes, a ratio of the major radius to the minor radius may be not greater than 3. Thus, the electric field at the corners 2$c$, 9$c$ can be assuredly made smaller than that when the corners 2$c$, 9$c$ are laid over each other. In the semiconductor power module 101, either pair or each pair of, the heat spreader and the conductive layer, and the second lead frame 4 and the third lead frame 7, may be the adjacent two electrodes having the corners arranged as described above. Thus, it is possible to reduce the electric field around the corners of either pair or each pair of, the heat spreader and the conductive layer, and the second lead frame 4 and the third lead frame 7.

Second Embodiment

Figure 9:
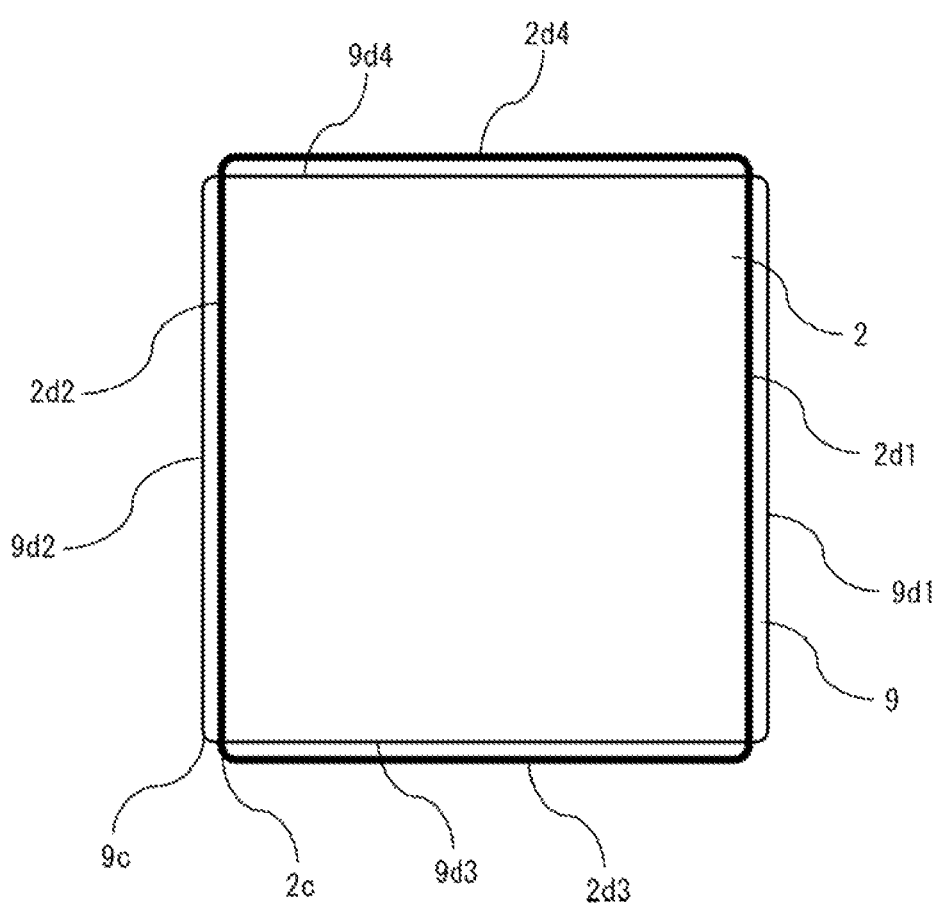
FIG. 9 is a plan view showing adjacent two electrodes of a semiconductor power module according to the second embodiment of the present disclosure.
Figure 10:
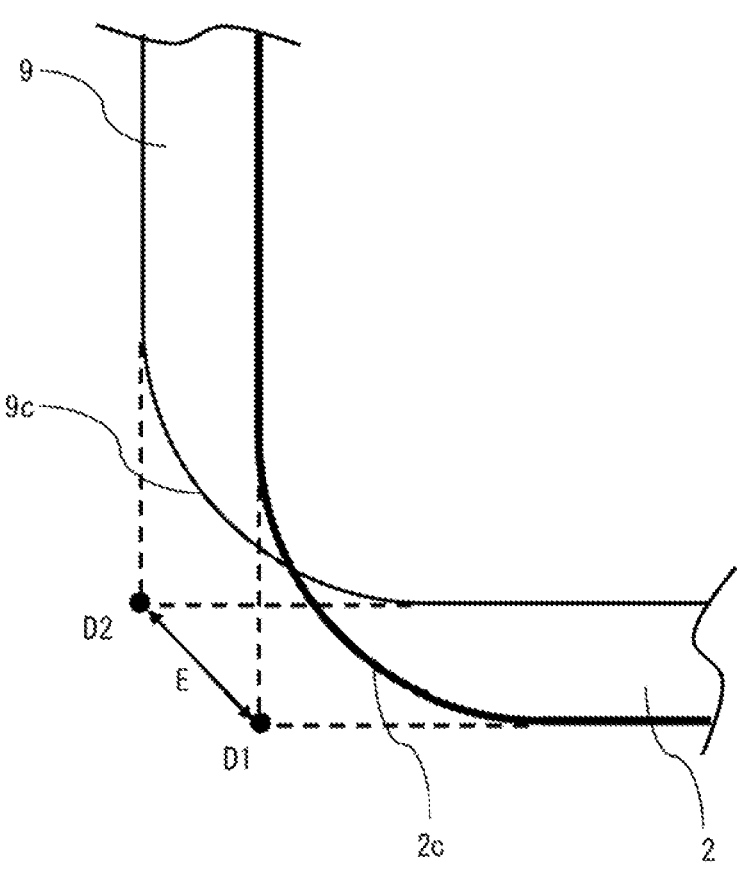
FIG. 10 is a plan view showing corners of the adjacent two electrodes of the semiconductor power module according to the second embodiment.
Figure 11:
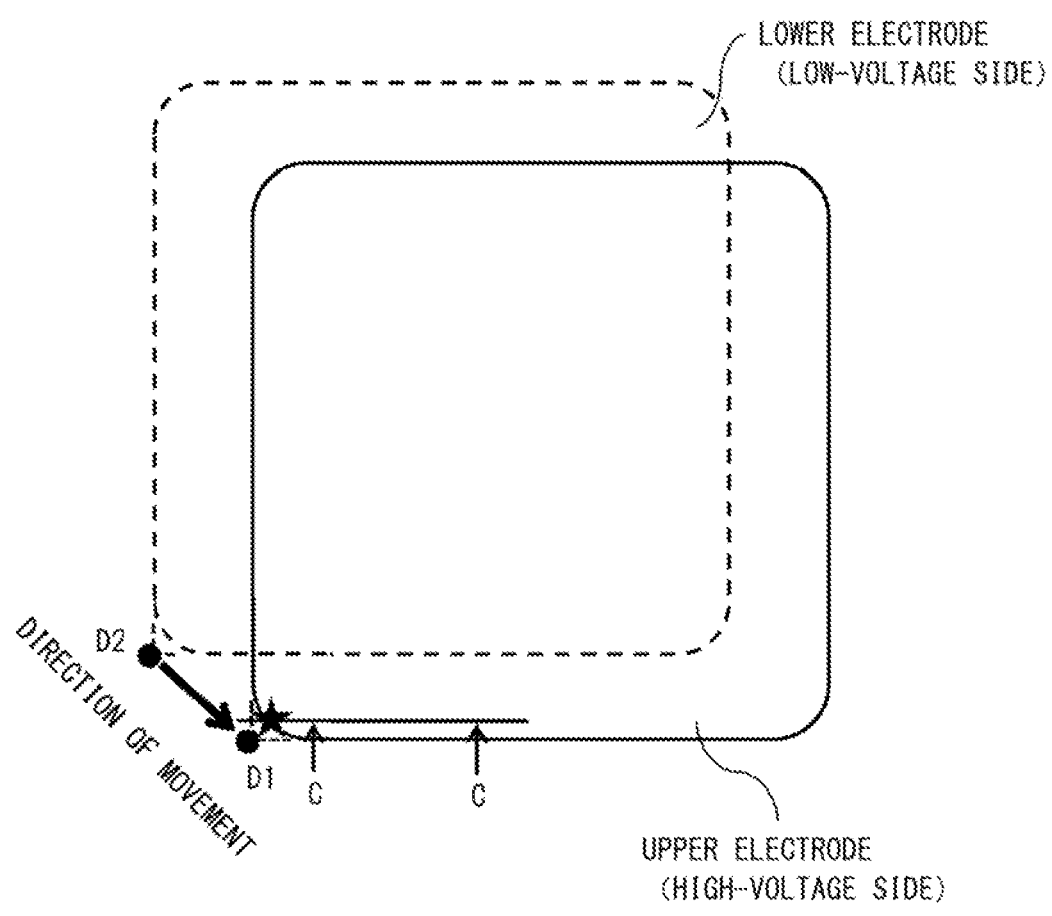
FIG. 11 illustrates movement between the corners of the adjacent two electrodes of the semiconductor power module according to the second embodiment.
Figure 12:
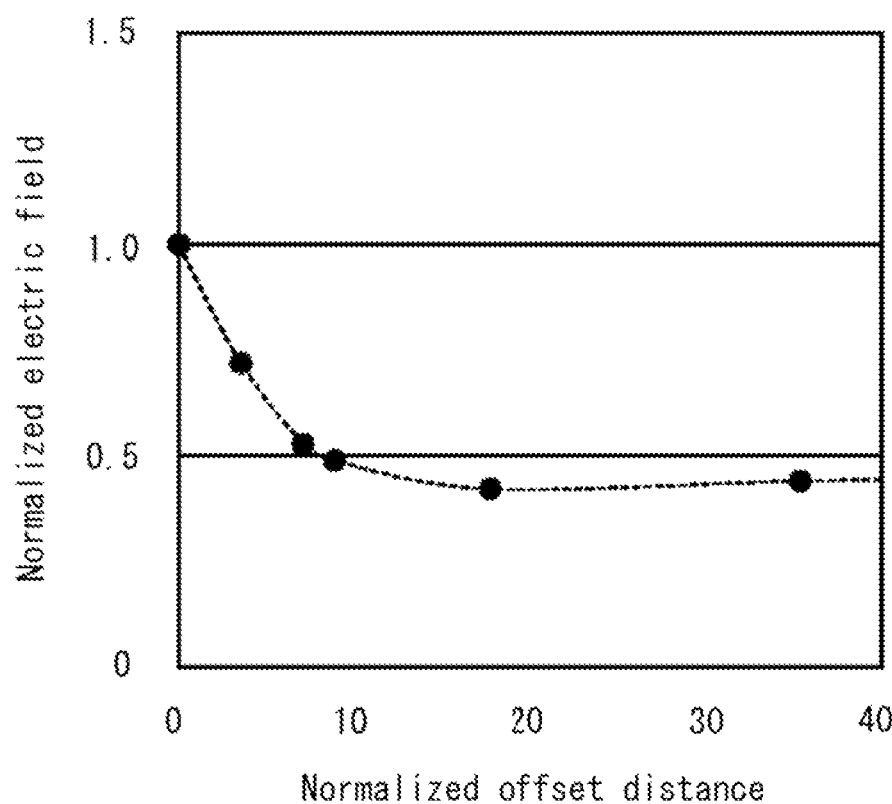
FIG. 12 shows a normalized electric field value at the corner of the electrode of the semiconductor power module according to the second embodiment.
Figure 13:
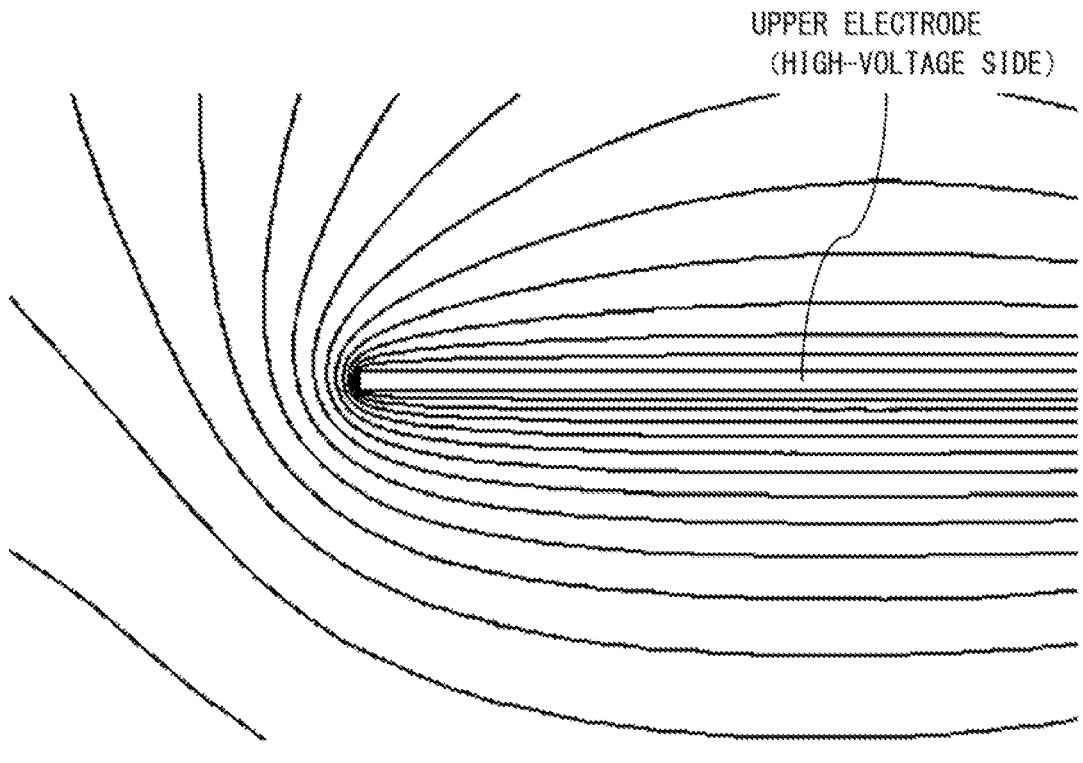
FIG. 13 is an equipotential line diagram around the electrode taken at a C-C cross-section position in FIG. 11.
Figure 14:
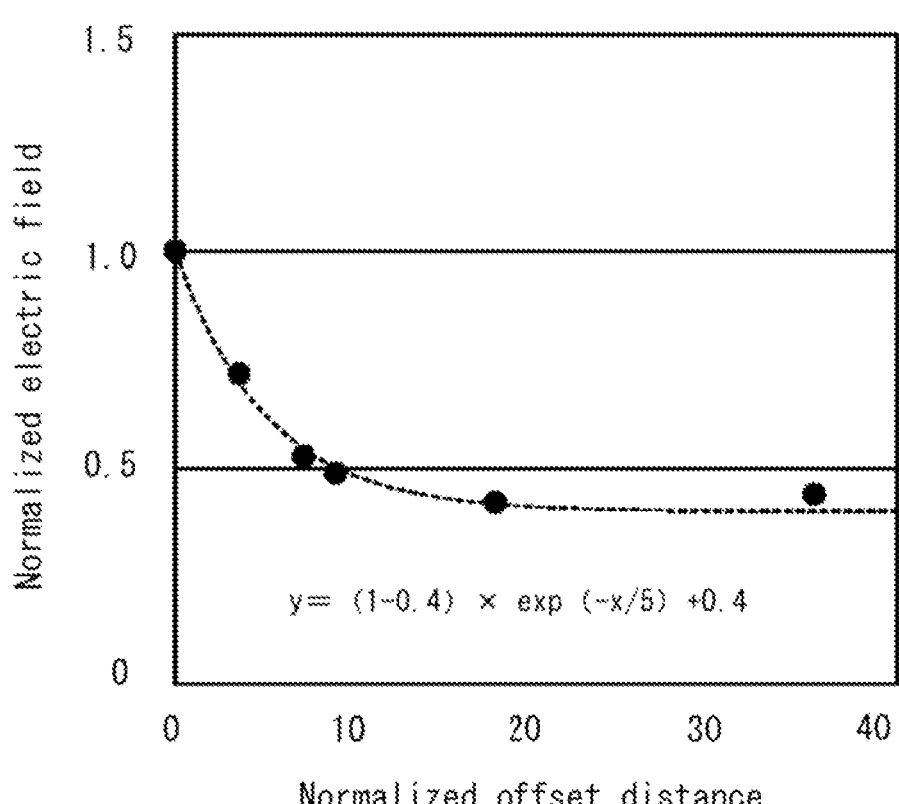
FIG. 14 shows an approximation curve of the normalized electric field value at the corner of the electrode of the semiconductor power module according to the second embodiment.

A semiconductor power module 101 according to the second embodiment of the present disclosure will be described. FIG. 9 is a plan view showing adjacent two electrodes of the semiconductor power module 101 according to the second embodiment, in which the first heat spreader 2 and the first conductive layer 9 shown in FIG. 1 are seen through. FIG. 10 is a plan view showing corners of the adjacent two electrodes of the semiconductor power module 101, in which the corner 2$c$ of the first heat spreader 2 and the corner 9$c$ of the first conductive layer 9 are seen through. FIG. 11 illustrates movement between the corners of the adjacent two electrodes of the semiconductor power module. FIG. 12 shows a normalized electric field value at the corner of the electrode of the semiconductor power module 101. FIG. 13 is an equipotential line diagram around the electrode taken at a C-C cross-section position in FIG. 11. FIG. 14 shows an approximation curve of the normalized electric field value at the corner of the electrode of the semiconductor power module 101. In the semiconductor power module 101 according to the second embodiment, the shapes of the corners of the adjacent two electrodes are the same shape.

The plurality of electrodes are formed in plate shapes, and the shapes of the corners are circular-arc shapes or elliptical-arc shapes and are the same shape. Regarding the adjacent two electrodes, an intersection of extended lines of side lines on both sides of the corner of the one electrode is defined as a first intersection, an intersection of extended lines of side lines on both sides of the corner of the other electrode is defined as a second intersection, and a distance between the adjacent first and second intersections is defined as an intersection-intersection distance. The intersection-intersection distance has a value greater than 0. The relationship between the intersection-intersection distance and the electric field at the corner of each of the adjacent two electrodes is represented by an exponential function or a logarithmic function.

A specific configuration in the present embodiment will be described with reference to FIG. 9 and FIG. 10. In these drawings, the plurality of electrodes are the first heat spreader 2 and the first conductive layer 9. The shapes of the corner 2$c$ of the first heat spreader 2 and the corner 9$c$ of the first conductive layer 9 are circular-arc shapes and are the same shape. As shown in FIG. 9, side lines 2$d1$, 2$d2$ which are two opposite side lines in one direction of the first heat spreader 2 are longer than side lines 9$d1$, 9$d2$ which are two opposite side lines in the one direction of the first conductive layer 9, and side lines 2$d3$, 2$d4$ which are two opposite side lines in another direction of the first heat spreader 2 are shorter than side lines 9$d3$, 9$d4$ which are two opposite side lines in the other direction of the first conductive layer 9. With this configuration, as seen in the direction in which the first heat spreader 2 and the first conductive layer 9 are laid over each other, at least a part of the corner of the first heat spreader 2 is provided on the outer side relative to the first conductive layer 9, and at least a part of the corner of the first conductive layer 9 is provided on the outer side relative to the first heat spreader 2.

An intersection of extended lines of side lines on both sides of the corner 2$c$ of the first heat spreader 2 is defined as a first intersection D1, and an intersection of extended lines of side lines on both sides of the corner 9c of the first conductive layer 9 is defined as a second intersection D2. An intersection-intersection distance E which is a distance between the first intersection D1 and the second intersection D2 has a value greater than 0. The relationship between the intersection-intersection distance E and the electric field at each corner 2c, 9c is represented by an exponential function or a logarithmic function.

With this configuration, the intersection-intersection distance has a value greater than 0, and the relationship between the intersection-intersection distance E and the electric field at the corner of each of the adjacent two electrodes is represented by an exponential function or a logarithmic function. Therefore, the corner of the one electrode is not laid over the other electrode as seen in the direction in which the adjacent two electrodes are laid over each other, and the corner of the other electrode is not laid over the one electrode as seen in the direction in which the adjacent two electrodes are laid over each other. Thus, for both electrodes, the electric field at the corners of the electrodes and around the corners can be reduced. In addition, for both electrodes, by using the exponential function or the logarithmic function representing the relationship between the intersection-intersection distance E and the electric field at the corner of each electrode, it is possible to easily adjust the relationship between the intersection-intersection distance E and the electric field at the corner of each electrode. In addition, since the shapes of the corners are circular-arc shapes or elliptical-arc shapes and are the same shape, the manufacturing process for the electrodes is simplified, whereby the takt time for the semiconductor power module 101 can be shortened. Hereinafter, the details of an electric field relaxing structure in the present embodiment will be described.

The horizontal axis in FIG. 12 indicates a value normalized by dividing the intersection-intersection distance between the upper electrode and the lower electrode in FIG. 11 by the major radius or the curvature radius of the shape of the corner. A case where the value on the horizontal axis is 0 indicates a state in which both corners of the upper electrode and the lower electrode are laid over each other. Since the upper electrode and the lower electrode have circular-arc shapes in FIG. 11, normalization is performed by dividing the intersection-intersection distance by the curvature radius. The vertical axis in FIG. 12 indicates the electric field at the corner part (star-mark part in FIG. 11) of the upper electrode normalized such that the electric field when the corners of the lower electrode and the upper electrode are laid over each other is defined as 1. The electric field at the lower electrode also exhibits a tendency similar to that in FIG. 12. From FIG. 12, it is found that, when the intersection-intersection distance increases, the electric field at each electrode is reduced. This is because the corner of the one electrode is not laid over the other electrode so that equipotential lines do not concentrate, as shown in FIG. 13.

The aforementioned exponential function and logarithmic function will be described. A value obtained by dividing the electric field at the corner of the one electrode or the other electrode by an overlap electric field which is the electric field at the corner when the corners of both electrodes overlap each other as seen in the direction in which the one electrode and the other electrode are laid over each other, is denoted by y, and a value obtained by dividing the intersection-intersection distance by the curvature radius in a case where the shapes of the corners are the circular-arc shapes or a value obtained by dividing the intersection-intersection distance by the major radius in a case where the shapes of the corners are the elliptical-arc shapes, is denoted by x. Then, the aforementioned exponential function or logarithmic function is as follows:

$$y = (1 - 0.4) \times \exp(-x/5) + 0.4 \tag{1}$$

or $$x = 5 \times \ln\{(1 - 0.4)/(y - 0.4)\} \tag{2}$$

FIG. 14 shows an approximation curve of the normalized electric field value in FIG. 12, and an approximation expression thereof. In the approximation expression, x corresponds to the value on the horizontal axis in FIG. 12. In the approximation expression, y corresponds to the value on the vertical axis in FIG. 12. By representing the exponential function or the logarithmic function by the approximation expression shown in Expression (1) or (2) as described above, it is possible to easily determine the intersection-intersection distance so as to satisfy the above approximation expression with respect to a desired electric field. Since the intersection-intersection distance is easily determined, the electric field generated at the corner can be easily made to be a desired electric field.

Also for the other corners not shown in FIG. 10, the intersection-intersection distance has a value greater than 0 in the same manner. Also for the corners of a pair of electrodes that are the second lead frame 4 and the third lead frame 7, the intersection-intersection distance can have a value greater than 0. That is, either pair or each pair of, the heat spreader and the conductive layer, and the second lead frame 4 and the third lead frame 7, are the adjacent two electrodes. With this configuration, also between the second lead frame 4 and the third lead frame 7, the electric field generated at the corner can be easily made to be a desired electric field.

Figure 15:
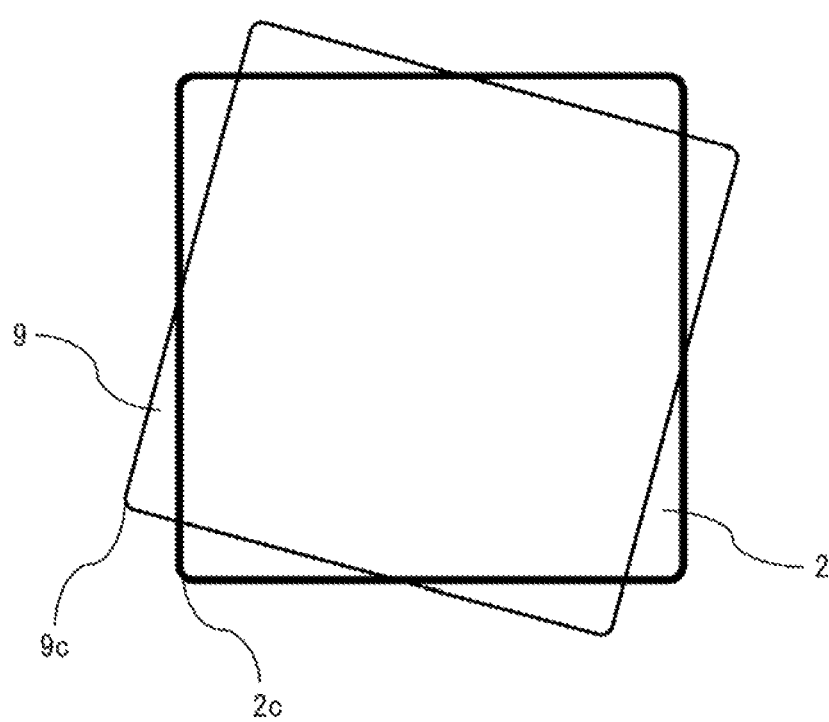
FIG. 15 is a plan view showing adjacent two electrodes of another semiconductor power module according to the second embodiment.

The configuration of the adjacent two electrodes of the semiconductor power module 101 in which the intersection-intersection distance has a value greater than 0 is not limited to that shown in FIG. 9, and may be a configuration shown in FIG. 15. FIG. 15 is a plan view showing adjacent two electrodes of another semiconductor power module 101 according to the second embodiment, in which the first heat spreader 2 and the first conductive layer 9 are seen through. The first heat spreader 2 and the first conductive layer 9 have the same shape as seen in the direction in which the first heat spreader 2 and the first conductive layer 9 are laid over each other. As seen in the direction in which the first heat spreader 2 and the first conductive layer 9 are laid over each other, FIG. 15 shows a configuration in which the corners of the first heat spreader 2 and the first conductive layer 9 are arranged so as not to be laid over each other by rotating either electrode from a state in which their corners are laid over each other. Also in this arrangement, the corner of the one electrode is not laid over the other electrode as seen in the direction in which the adjacent two electrodes are laid over each other, and the corner of the other electrode is not laid over the one electrode as seen in the direction in which the adjacent two electrodes are laid over each other.

As described above, the plurality of electrodes are formed in plate shapes, and shapes of the corners are circular-arc shapes or elliptical-arc shapes and are the same shape. Regarding the adjacent two electrodes, an intersection of extended lines of side lines on both sides of the corner of the one electrode is defined as a first intersection, an intersection of extended lines of side lines on both sides of the corner of the other electrode is defined as a second intersection, and a distance between the adjacent first and second intersections is defined as an intersection-intersection distance. The intersection-intersection distance has a value greater than 0. A relationship between the intersection-intersection distance and an electric field at the corner of each of the adjacent two electrodes is represented by an exponential function or a logarithmic function. Therefore, the corner of the one electrode is not laid over the other electrode as seen in the direction in which the adjacent two electrodes are laid over each other, and the corner of the other electrode is not laid over the one electrode as seen in the direction in which the adjacent two electrodes are laid over each other. Thus, for both electrodes, the electric field at the corners of the electrodes and around the corners can be reduced. In addition, for both electrodes, by using the exponential function or the logarithmic function representing the relationship between the intersection-intersection distance E and the electric field at the corner of each electrode, it is possible to easily adjust the relationship between the intersection-intersection distance E and the electric field at the corner of each electrode. In addition, since the shapes of the corners are circular-arc shapes or elliptical-arc shapes and are the same shape, the manufacturing process for the electrodes is simplified, whereby the takt time for the semiconductor power module 101 can be shortened. Since the takt time for the semiconductor power module 101 is shortened, productivity of the semiconductor power module 101 can be improved.

A value obtained by dividing the electric field at the corner of the one electrode or the other electrode by an overlap electric field which is the electric field at the corner when the corners of both electrodes overlap each other as seen in the direction in which the one electrode and the other electrode are laid over each other, may be denoted by y, a value obtained by dividing the intersection-intersection distance by a curvature radius in a case where the shapes of the corners are the circular-arc shapes or a value obtained by dividing the intersection-intersection distance by a major radius in a case where the shapes of the corners are the elliptical-arc shapes, may be denoted by x, and the aforementioned exponential function or logarithmic function may be as follows:

$$y = (1 - 0.4) \times \exp(-x/5) + 0.4$$

or $$x = 5 \times \ln\{(1 - 0.4)/(y - 0.4)\}.$$

Thus, by representing the exponential function or the logarithmic function by the approximation expression as described above, it is possible to easily determine the intersection-intersection distance so as to satisfy the above approximation expression with respect to a desired electric field. Since the intersection-intersection distance is easily determined, the electric field generated at the corner can be easily made to be a desired electric field.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 first lead frame
2 first heat spreader
2a first surface
2b second surface
2c corner
2c1 first part
2c2 second part
2d1, 2d2, 2d3, 2d4 side line
3 first power semiconductor element
4 second lead frame
5 second heat spreader
5a first surface
5b second surface
6 second power semiconductor element
7 third lead frame
8 first insulating layer
9 first conductive layer
9c corner
9c1 first part
9c2 second part
9d1, 9d2, 9d3, 9d4 side line
10 second insulating layer
11 second conductive layer
12 sealing resin
13 first side line
14 second side line
101 semiconductor power module
101a one-side surface
101b other-side surface
D1 first intersection
D2 second intersection
E intersection-intersection distance

What is claimed is:

1. A semiconductor power module comprising a plurality of electrodes having different potentials and laid over each other with an interval therebetween, wherein as seen in a direction in which the plurality of electrodes are laid over each other, each of the plurality of electrodes has three or more corners, at least a part of the corner of one of adjacent two of the electrodes is provided on an outer side relative to another of the adjacent two electrodes, and at least a part of the corner of the other electrode is provided on an outer side relative to the one electrode.

2. The semiconductor power module according to claim 1, wherein the plurality of electrodes are formed in plate shapes, side-line parts on both sides of the corners of the adjacent two electrodes overlap each other as seen in the direction in which the plurality of electrodes are laid over each other, and in the adjacent two electrodes, a shape of the corner of the one electrode and a shape of the corner of the other electrode are different from each other such that a first part of the corner of the one electrode is located on an outer side relative to a first part of the corner of the other electrode, and a second part of the corner of the other electrode is located on an outer side relative to a second part of the corner of the one electrode.

3. The semiconductor power module according to claim 2, wherein the shape of the corner of each of the adjacent two electrodes is an elliptical-arc shape, and a first distance from a curvature start point to a curvature middle point of the elliptical-arc shape and a second distance from a curvature end point to the curvature middle point of the elliptical-arc shape are different from each other, a longer one of the first distance and the second distance is defined as a major radius and a shorter one is defined as a minor radius, and the major radiuses in the adjacent two electrodes cross each other as seen in the direction in which the plurality of electrodes are laid over each other.

4. The semiconductor power module according to claim 3, wherein in each of the adjacent two electrodes, a ratio of the major radius to the minor radius is not greater than 3.

5. The semiconductor power module according to claim 1, wherein the plurality of electrodes are formed in plate shapes, and shapes of the corners are circular-arc shapes or elliptical-arc shapes and are the same shape, regarding the adjacent two electrodes, an intersection of extended lines of side lines on both sides of the corner of the one electrode is defined as a first intersection, an intersection of extended lines of side lines on both sides of the corner of the other electrode is defined as a second intersection, and a distance between the adjacent first and second intersections is defined as an intersection-intersection distance, the intersection-intersection distance has a value greater than 0, and a relationship between the intersection-intersection distance and an electric field at the corner of each of the adjacent two electrodes is represented by an exponential function or a logarithmic function.

6. The semiconductor power module according to claim 5, wherein a value obtained by dividing the electric field at the corner of the one electrode or the other electrode by an overlap electric field which is the electric field at the corner when the corners of both electrodes overlap each other as seen in the direction in which the one electrode and the other electrode are laid over each other, is denoted by y, a value obtained by dividing the intersection-intersection distance by a curvature radius in a case where the shapes of the corners are the circular-arc shapes or a value obtained by dividing the intersection-intersection distance by a major radius in a case where the shapes of the corners are the elliptical-arc shapes, is denoted by x, and the exponential function or the logarithmic function is as follows:

$$y = (1 - 0.4) \times \exp(-x/5) + 0.4$$

or $$x = 5 \times \ln\{(1 - 0.4)/(y - 0.4)\}.$$

7. The semiconductor power module according to claim 1, comprising:

a first heat spreader and a second heat spreader which are heat spreaders formed in plate shapes and arranged side by side;

a first power semiconductor element which is a power semiconductor element formed in a plate shape and joined to a one-side surface of the first heat spreader, and a second power semiconductor element which is a power semiconductor element formed in a plate shape and joined to a one-side surface of the second heat spreader;

a first conductive layer which is a conductive layer formed in a plate shape and joined to an other-side surface of the first heat spreader via an insulating layer, and a second conductive layer which is a conductive layer formed in a plate shape and joined to an other-side surface of the second heat spreader via an insulating layer;

a first lead frame whose other-side surface is joined to the one-side surface of the first heat spreader;

a second lead frame which extends in an arrangement direction of the heat spreaders and whose other-side surface is, at one end, joined to a one-side surface of the first power semiconductor element, and is, at another end, joined to the one-side surface of the second heat spreader; and a third lead frame which extends in the arrangement direction of the heat spreaders and whose other-side surface is, at one end, joined to a one-side surface of the second power semiconductor element and is, at least partially, arranged being laid over a one-side surface of the second lead frame with an interval therebetween, wherein either pair or each pair of, the heat spreader and the conductive layer, and the second lead frame and the third lead frame, are the adjacent two electrodes.

8. The semiconductor power module according to claim 2, comprising:

a first heat spreader and a second heat spreader which are heat spreaders formed in plate shapes and arranged side by side;

a first power semiconductor element which is a power semiconductor element formed in a plate shape and joined to a one-side surface of the first heat spreader, and a second power semiconductor element which is a power semiconductor element formed in a plate shape and joined to a one-side surface of the second heat spreader;

a first conductive layer which is a conductive layer formed in a plate shape and joined to an other-side surface of the first heat spreader via an insulating layer, and a second conductive layer which is a conductive layer formed in a plate shape and joined to an other-side surface of the second heat spreader via an insulating layer;

a first lead frame whose other-side surface is joined to the one-side surface of the first heat spreader;

a second lead frame which extends in an arrangement direction of the heat spreaders and whose other-side surface is, at one end, joined to a one-side surface of the first power semiconductor element, and is, at another end, joined to the one-side surface of the second heat spreader; and a third lead frame which extends in the arrangement direction of the heat spreaders and whose other-side surface is, at one end, joined to a one-side surface of the second power semiconductor element and is, at least partially, arranged being laid over a one-side surface of the second lead frame with an interval therebetween, wherein either pair or each pair of, the heat spreader and the conductive layer, and the second lead frame and the third lead frame, are the adjacent two electrodes.

9. The semiconductor power module according to claim 3, comprising:

a first heat spreader and a second heat spreader which are heat spreaders formed in plate shapes and arranged side by side;

a first power semiconductor element which is a power semiconductor element formed in a plate shape and joined to a one-side surface of the first heat spreader, and a second power semiconductor element which is a power semiconductor element formed in a plate shape and joined to a one-side surface of the second heat spreader;

a first conductive layer which is a conductive layer formed in a plate shape and joined to an other-side surface of the first heat spreader via an insulating layer, and a second conductive layer which is a conductive layer formed in a plate shape and joined to an other-side surface of the second heat spreader via an insulating layer;

a first lead frame whose other-side surface is joined to the one-side surface of the first heat spreader;

a second lead frame which extends in an arrangement direction of the heat spreaders and whose other-side surface is, at one end, joined to a one-side surface of the first power semiconductor element, and is, at another end, joined to the one-side surface of the second heat spreader; and a third lead frame which extends in the arrangement direction of the heat spreaders and whose other-side surface is, at one end, joined to a one-side surface of the second power semiconductor element and is, at least partially, arranged being laid over a one-side surface of the second lead frame with an interval therebetween, wherein either pair or each pair of, the heat spreader and the conductive layer, and the second lead frame and the third lead frame, are the adjacent two electrodes.

10. The semiconductor power module according to claim 4, comprising:

a first heat spreader and a second heat spreader which are heat spreaders formed in plate shapes and arranged side by side;

a first power semiconductor element which is a power semiconductor element formed in a plate shape and joined to a one-side surface of the first heat spreader, and a second power semiconductor element which is a power semiconductor element formed in a plate shape and joined to a one-side surface of the second heat spreader;

a first conductive layer which is a conductive layer formed in a plate shape and joined to an other-side surface of the first heat spreader via an insulating layer, and a second conductive layer which is a conductive layer formed in a plate shape and joined to an other-side surface of the second heat spreader via an insulating layer;

a first lead frame whose other-side surface is joined to the one-side surface of the first heat spreader;

a second lead frame which extends in an arrangement direction of the heat spreaders and whose other-side surface is, at one end, joined to a one-side surface of the first power semiconductor element, and is, at another end, joined to the one-side surface of the second heat spreader; and a third lead frame which extends in the arrangement direction of the heat spreaders and whose other-side surface is, at one end, joined to a one-side surface of the second power semiconductor element and is, at least partially, arranged being laid over a one-side surface of the second lead frame with an interval therebetween, wherein either pair or each pair of, the heat spreader and the conductive layer, and the second lead frame and the third lead frame, are the adjacent two electrodes.

11. The semiconductor power module according to claim 5, comprising:

a first heat spreader and a second heat spreader which are heat spreaders formed in plate shapes and arranged side by side;

a first power semiconductor element which is a power semiconductor element formed in a plate shape and joined to a one-side surface of the first heat spreader, and a second power semiconductor element which is a power semiconductor element formed in a plate shape and joined to a one-side surface of the second heat spreader;

a first conductive layer which is a conductive layer formed in a plate shape and joined to an other-side surface of the first heat spreader via an insulating layer, and a second conductive layer which is a conductive layer formed in a plate shape and joined to an other-side surface of the second heat spreader via an insulating layer;

a first lead frame whose other-side surface is joined to the one-side surface of the first heat spreader;

a second lead frame which extends in an arrangement direction of the heat spreaders and whose other-side surface is, at one end, joined to a one-side surface of the first power semiconductor element, and is, at another end, joined to the one-side surface of the second heat spreader; and a third lead frame which extends in the arrangement direction of the heat spreaders and whose other-side surface is, at one end, joined to a one-side surface of the second power semiconductor element and is, at least partially, arranged being laid over a one-side surface of the second lead frame with an interval therebetween, wherein either pair or each pair of, the heat spreader and the conductive layer, and the second lead frame and the third lead frame, are the adjacent two electrodes.

12. The semiconductor power module according to claim 6, comprising:

a first heat spreader and a second heat spreader which are heat spreaders formed in plate shapes and arranged side by side;

a first power semiconductor element which is a power semiconductor element formed in a plate shape and joined to a one-side surface of the first heat spreader, and a second power semiconductor element which is a power semiconductor element formed in a plate shape and joined to a one-side surface of the second heat spreader;

a first conductive layer which is a conductive layer formed in a plate shape and joined to an other-side surface of the first heat spreader via an insulating layer, and a second conductive layer which is a conductive layer formed in a plate shape and joined to an other-side surface of the second heat spreader via an insulating layer;

a first lead frame whose other-side surface is joined to the one-side surface of the first heat spreader;

a second lead frame which extends in an arrangement direction of the heat spreaders and whose other-side surface is, at one end, joined to a one-side surface of the first power semiconductor element, and is, at another end, joined to the one-side surface of the second heat spreader; and a third lead frame which extends in the arrangement direction of the heat spreaders and whose other-side surface is, at one end, joined to a one-side surface of the second power semiconductor element and is, at least partially, arranged being laid over a one-side surface of the second lead frame with an interval therebetween, wherein either pair or each pair of, the heat spreader and the conductive layer, and the second lead frame and the third lead frame, are the adjacent two electrodes.

* * * * *